United States Patent
Shibata et al.

(10) Patent No.: US 8,552,533 B2
(45) Date of Patent: Oct. 8, 2013

(54) COMPOUND SEMICONDUCTOR SUBSTRATE AND METHOD FOR MANUFACTURING THE SAME

(75) Inventors: Yoshihiko Shibata, Tokyo (JP); Masatoshi Miyahara, Tokyo (JP); Takashi Ikeda, Tokyo (JP); Yoshihisa Kunimi, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 289 days.

(21) Appl. No.: 12/677,627

(22) PCT Filed: Sep. 12, 2008

(86) PCT No.: PCT/JP2008/066537
§ 371 (c)(1),
(2), (4) Date: Mar. 11, 2010

(87) PCT Pub. No.: WO2009/035079
PCT Pub. Date: Mar. 19, 2009

(65) Prior Publication Data
US 2010/0200956 A1    Aug. 12, 2010

(30) Foreign Application Priority Data

Sep. 12, 2007    (JP) ................................. 2007-237030

(51) Int. Cl.
*H01L 29/30*    (2006.01)
(52) U.S. Cl.
USPC .................................. 257/617; 257/E21.328
(58) Field of Classification Search
USPC ........................................................ 257/617
See application file for complete search history.

(56) References Cited

U.S. PATENT DOCUMENTS 5,844,260 A * 12/1998 Ohori ........................... 257/190

FOREIGN PATENT DOCUMENTS

| JP | 1-095577 | 4/1989 |
| JP | 7-193331 | 7/1995 |
| JP | 07-240378 | 9/1995 |
| JP | 7-249577 | 9/1995 |
| JP | 7-263357 | 10/1995 |
| JP | 8-306622 | 11/1996 |
| JP | 9-027451 | 1/1997 |

OTHER PUBLICATIONS

Bringans et al., "Atomic-step rearrangement on Si(100) by interaction with arsenic and the implication for GaAs-on-Si epitaxy", Physical Review B, 44:7, Aug. 1991, pp. 3054-3063.*

(Continued)

*Primary Examiner* — Daniel Whalen
(74) *Attorney, Agent, or Firm* — Morgan, Lewis & Bockius LLP

(57) ABSTRACT

A method for manufacturing the compound semiconductor substrate having a reduced dislocation density at an interface between a Si substrate. Contaminants, such as organic matter and metal, on a surface of a Si substrate are removed whereby a flat oxide film is formed. The oxide film on the surface is removed by using an aqueous hydrogen fluoride solution, whereby hydrogen termination treatment is performed. Immediately after being subjected to the hydrogen termination treatment the temperature of the Si substrate is raised in a vacuum apparatus. If the substrate temperature is raised without any operation, the termination hydrogen is released. Before the hydrogen is released, pre-irradiation with As is performed. Thus, an interface between the Si substrate and the compound semiconductor layer is prepared. Several minutes later, irradiation with Ga and As is performed. Thereby, the compound semiconductor is formed.

14 Claims, 6 Drawing Sheets

(56) References Cited

OTHER PUBLICATIONS

Pribat, et al., "Defect Filtering in GaAs on Si by Conformal Growth", Japanese Journal of Applied Physics, 30, pp. 431-434, 1991.
Nishi, S. et al., "*Growth of Single Domain GaAs on 2-inch Si(100) Substrate by Molecular Beam Epitaxy*", Japanese Journal of Applied Physics, vol. 24, No. 6, Jun. 1985, pp. L391-L393.
Kitahara, et al., "Control of GaAs on Si Interface Using Atomic Layer Epitaxy", Japanese Journal of Applied Physics, 29: Dec. 12, 1990, 2457-2459.
Kawabe, et al., "Initial Stage and Domain Structure of GaAs Grown on Si(100) by Molecular Beam Epitaxy", Japanese Journal of Applied Physics, 26:Feb. 2, 1987, 114-116.
Kitahara, et al., "Reflection High-Energy Electron Diffraction of Heteroepitaxy in Chemical Vapor Deposition Reactor:fl Atomic-Layer Epitaxy of GaAs, AlAs and GaP on Si", Japanese Journal of Applied Physics, 32: Mar. 1, 1993, 1051-1055.
Bringans, et al., "Atomic-step rearrangement on Si(100) by interaction with arsenic and the implication for GaAs-on-Si Epitaxy", Physical Review B, 44: Aug. 7, 1991, 3054-3063.
Uneta, et al., "Domain Structures of As-Adsorbed Si(100) Surface and GaAs Overlayer", Japanese Journal of Applied Physics, 29: Jan. 1, 1990, 17-19.
European Search Report dated Aug. 26, 2011.
Official Notice of Rejection dated May 31, 2013 from the Japanese Patent Office in counterpart Japanese application No. 2009-532239.

* cited by examiner

COMPOUND SEMICONDUCTOR SUBSTRATE AND METHOD FOR MANUFACTURING THE SAME

TECHNICAL FIELD

The present invention relates to: a compound semiconductor substrate having a laminated structure which enables reduction of crystal dislocations (defects) of a compound semiconductor layer formed on a Si substrate usable in electronic devices such as HEMTs and HBTs, optical devices, magnetic sensors, and the like, and also enables quality improvement accompanying the reduction; a method for manufacturing the same; and a semiconductor device using the compound semiconductor substrate.

BACKGROUND ART

Recently, in relation to thin film crystal growth technologies for compound semiconductors, semiconductor devices using compound semiconductor substrates have been developed markedly while exhibiting various characteristics. Examples of such semiconductor devices include: electronic devices such as an HEMT (high electron mobility transistor) and an HBT (heterojunction bipolar transistor); optical devices; solar cells; ultrahigh-speed devices using two-dimensional electron gas; magnetic sensors; and the like.

However, it is difficult to grow a large crystal for a compound semiconductor substrate. Moreover, since a compound semiconductor substrate is brittle and easily broken, care is required in treating the compound semiconductor substrate during a manufacturing process. Meanwhile, since a compound semiconductor is expensive, transition to a compound semiconductor substrate having a large diameter is necessary. However, a compound semiconductor substrate having a large diameter is heavy and brittle, and hence there is a concern about the yield.

In this connection, attention has been focused on technologies for forming a compound semiconductor on a group IV semiconductor substrate which is inexpensive, excellent in crystallinity, light in weight, and suitable for achieving a larger diameter. In particular, research has been actively conducted on technologies for growing thin film crystals of GaAs, which is a compound semiconductor, on a Si substrate for which a production technology has been established. Additionally, in the case of using a compound semiconductor substrate in a device, characteristic distribution over an entirety of the compound semiconductor substrate needs to be narrow.

However, various problems arise when epitaxial growth is performed on a Si substrate. This is because a crystal of Si and a crystal of a compound semiconductor have different lattice constants and coefficients of thermal expansion, and hence misfit occurs therebetween. For example, the lattice constants of Si and GaAs differ by 4%, and there is a two-fold difference between the coefficients of thermal expansion of Si and GaAs. Under such conditions, it is not easy to perform epitaxial growth on a Si substrate.

Moreover, regarding a surface treatment of the Si substrate, it is important to remove $SiO_2$, which is an oxide on the Si substrate, before the epitaxial growth of a compound semiconductor.

In a first method for removing the oxide, the oxide can be removed by raising the temperature of the Si substrate under high vacuum. From an industrial perspective, however, the first method has poor mass-productivity because of an inferior TAT thereof.

As a second method for removing the oxide, there is a method for removing the oxide by chemically treating the Si substrate. In the second method, the oxide is removed by treating the Si substrate with hydrofluoric acid before the Si substrate is placed in a film formation apparatus. Moreover, a surface of the Si substrate is protected in a hydrogen-terminated state, whereby oxidation after the treatment is prevented. In the second method, initial growth which controls release of termination hydrogen is also necessary.

As an example of a conventional industrial technique for growing a group III-V compound semiconductor on a hydrogen-terminated Si substrate, Patent Document 1 discloses a method, regarding InSb, for producing a hetero-epitaxial film. In this method, two-stage growth is performed by forming an under-layer of at least any one of aluminum, gallium, and indium in initial growth on a Si substrate of two-stage growth. However, a high quality GaAs film cannot be obtained by a similar method.

Particularly, when a compound semiconductor having a different lattice constant or a different coefficient of thermal expansion is grown on a Si substrate, many dislocations and lamination stacking faults are created at an interface between Si and a compound semiconductor layer, even with a two-stage or three-stage growth process being employed. Such dislocations (defects) inherent in an interface cause deterioration in quality of electrical characteristics of a compound semiconductor which serves as an active layer of an electronic device. Hence, electrical characteristics expected for an unimpaired compound semiconductor cannot be obtained. When a current flows in a direction perpendicular to a substrate face, for example, in an optical device, dislocations (defects) at the interface also influence the decrease in luminous efficacy.

Meanwhile, when an electronic device is fabricated by use of a compound semiconductor substrate obtained through hetero-epitaxial growth on Si, dislocations (defects) present at an interface, which are created in an initial stage of hetero-epitaxial growth process, affect characteristics of the above-described electronic device. This is because such dislocations (defects) are considered as one of factors that cause dislocations (defects) appearing in a surface of the compound semiconductor substrate.

For example, in a case of a Hall element, Patent Document 2 describes a fact that dislocations (defects) of a GaAs substrate lead to the worsening of an unbalanced (offset) voltage, which is an output voltage under no magnetic field, and discloses that the dislocations are improved by epitaxially growing GaAs on a GaAs substrate, whereby the unbalanced (offset) voltage is reduced.

Meanwhile, Patent Document 3 discloses a light emitting device which is, by using a substrate having low dislocations (defects), high in luminous efficacy and less likely to deteriorate.

Regarding crystal dislocations (defects), Non-Patent Document 1 discloses lateral growth as a growth method with which crystal dislocations (defects) are improved. The lateral growth achieves a local improvement in crystal dislocations (defects), and hence it is difficult to obtain a substrate having a high crystallinity over the entire surface of the substrate used. Moreover, there is a drawback that pretreatment of a substrate is complicated. When electronic devices, optical devices, magnetic sensors, or the like are produced in quantity by use of a compound semiconductor substrate, it is necessary to improve crystal dislocations (defects) over the entire surface of the substrate used, and thereby achieve a good yield.

However, in the above-described Patent Document 1, dislocations (defects) at the interface between the Si substrate and the compound semiconductor layer are not sufficiently reduced by the initial growth. Since the compound semiconductor layer is formed in a film thickness of 4.0 μm, the electrical characteristics influenced by defects created at the interface are seemingly improved. However, since an epitaxial layer as thick as 4.0 μm is necessary, the dislocations (defects) in the compound semiconductor layer are not improved. Moreover, GaAs films, which have a higher crystal growth temperature, having a quality enough for use in devices such as Hall elements have not been obtained industrially. In a case where a compound semiconductor is heteroepitaxially grown on a Si substrate, an initial stage in a heteroepitaxial growth process is most important.

The present invention has been made in view of such circumstances, and an object of the present invention is to provide: a compound semiconductor substrate which has, in a compound semiconductor layer on a Si substrate, a reduced dislocation (defect) density at any location of an interface between the Si substrate and the compound semiconductor layer, and has a large surface area of 10 cm$^2$ or more; and a method for producing the compound semiconductor substrate.

Another object of the present invention is to provide a semiconductor device using the compound semiconductor substrate, the semiconductor device being most suitable as an electronic device such as an HEMT or an HBT, an optical device, a solar cell, an ultrahigh-speed device using two-dimensional electron gas, or a magnetic sensor.

Patent Document 1: Japanese Patent Laid-Open No. Hei 7-249577

Patent Document 2: Japanese Patent Laid-Open No. Hei 1-95577

Patent Document 3: Japanese Patent Laid-Open No. Hei 7-193331

Non-Patent Document 1: D. Pribat et al., Jpn. J. Appl. Phys. 30, L431 (1991)

DISCLOSURE OF THE INVENTION

The present invention has been made to achieve the objects as described above. The present invention is characterized in that, in a compound semiconductor substrate in which compound semiconductor layer containing As is provided on a Si substrate, a substance having a higher As concentration than the compound semiconductor layer is present in an island-like manner at an interface between the Si substrate and the compound semiconductor layer.

The present invention is further characterized in that the island-like substance is made of part of constituent elements of any one of the Si substrate and the compound semiconductor layer.

The present invention is further characterized in that the island-like substance is not epitaxially grown with respect to the Si substrate.

The present invention is further characterized in that the island-like substance has a crystalline orientation different from those of the Si substrate and the compound semiconductor layer.

The present invention is further characterized in that crystal dislocations (defects) of the compound semiconductor layer are $5.0 \times 10^8$/cm$^2$ or more but $2.5 \times 10^{10}$/cm$^2$ or less at a location 10 nm away from the interface of the Si substrate and the compound semiconductor layer.

The present invention is further characterized in that a film thickness of the compound semiconductor layer is 0.1 μm or more but 2.0 μm or less.

The present invention is further characterized in that a surface area of a film formation surface of the Si substrate is 10 cm$^2$ or more.

The present invention is further characterized in that the compound semiconductor layer has a single domain structure.

The present invention is further characterized in that the compound semiconductor layer is made of In$_x$Al$_y$Ga$_z$As (x+y+z=1).

The present invention is further characterized in that the Si substrate is a Si thin-film substrate.

The present invention is further characterized in that, in a method for producing a compound semiconductor substrate, the method including the step of forming on a Si substrate a compound semiconductor layer containing As, the compound semiconductor layer is formed on the Si substrate by: immediately before a compound semiconductor is epitaxially grown on a hydrogen-terminated Si substrate, performing pre-irradiation with As at a substrate temperature lower than a temperature at which hydrogen is released; and sequentially stacking the compound semiconductor layer.

The present invention is further characterized in that, in a method for producing a compound semiconductor substrate, the method including the step of forming, on a Si substrate, a compound semiconductor layer containing As, the compound semiconductor layer is formed on the Si substrate by: performing pre-irradiation with As on a hydrogen-terminated Si substrate at a substrate temperature which is, for the avoidance of release of hydrogen, lower than a temperature at which hydrogen is released; and, further, before hydrogen is released from a surface of the substrate, supplying a group III element which forms the compound semiconductor.

The present invention is further characterized in that a surface area of a film formation surface of the Si substrate is 10 cm$^2$ or more.

The present invention is further characterized in that the compound semiconductor layer has a single domain structure.

The present invention is further characterized in that the compound semiconductor layer is made of In$_x$Al$_y$Ga$_z$As (x+y+z=1).

The present invention is further characterized in that the Si substrate is a Si thin-film substrate.

The present invention is further characterized by comprising any one of the above described compound semiconductor substrates used therein.

The present invention is further characterized in that the semiconductor device is any one of an electronic device, an optical device, a magnetic sensor, a solar cell, and an ultrahigh-speed device using two-dimensional electron gas.

As described above, in the present invention, it is necessary to control, immediately before the compound semiconductor layer is epitaxially grown on the hydrogen-terminated Si substrate, the timing of the release of termination hydrogen and the timing of the arrival of a source of the compound semiconductor at the Si substrate. Here, it was found that crystallinity at the interface between the Si substrate and the compound semiconductor layer is improved over the entire surface of the substrate as follows. Specifically, at a substrate temperature below a temperature at which hydrogen is released, pre-irradiation with a gaseous compound semiconductor material As is performed for preparation, so that As is uniformly distributed on a surface of the substrate. Before the hydrogen is released, a group III element starts to be supplied. Thereby, the compound semiconductor is stacked sequentially.

A GaAs film obtained on a Si substrate by the above-described method was analyzed by high-resolution ultrahigh-voltage transmission electron diffraction. As a result, a substance having a periodicity different from those of the Si substrate and the GaAs film was observed, as having an island-like shape, at an interface between the GaAs film and the Si substrate. It was found that the substance was not epitaxially grown on the Si substrate. Analysis of this substance by an electron energy loss spectrum (EELS) method showed that the substance contained As at a higher concentration than the GaAs film. It was found that portions, where no island-like substance was present, of the interface between the Si substrate and the GaAs had an excellent periodicity. Moreover, it was also found that the dislocation density of the GaAs film at a location 10 nm away from the interface was small and favorable.

The reason why a GaAs crystal with extremely high quality was obtained in the invention of the present application is presumably as follows. Specifically, the above-described island-like substance containing As absorbed strain, and, at locations where no island-like substance was present, hydrogen terminated by Si was well substituted with Ga. Thereby, epitaxial information of the Si substrate was successfully transferred to the GaAs.

Employment of the method of the invention of the present application makes it possible to: determine a size of the Si substrate by an upper limit size which allows the Si substrate to be installed in an epitaxial growth apparatus; and require no particular upper limitation on the size of the Si substrate. This is because, since the As used for the pre-irradiation is gaseous As with which the entire inside of an epitaxial growth apparatus is filled, the timing of arrival thereof at the Si substrate can be controlled independently of the size of the Si substrate.

The present invention provides an effect of enabling reduction of a dislocation (defect) density at the interface between the Si substrate and the compound semiconductor layer and an effect of enabling quality improvement of an electronic device, an optical device, or the like formed on the compound semiconductor layer. The present invention also enables quality improvement of electronic devices such as HEMTs and HBTs, optical devices, magnetic sensors and the like by using the compound semiconductor substrate for such electronic devices, the quality improvement accompanying the reduction in dislocation (defect) density at the interface.

BEST MODES FOR CARRYING OUT THE INVENTION

Hereinafter, examples of the present invention will be described with reference to the drawings.

EXAMPLE 1

Figure 1:
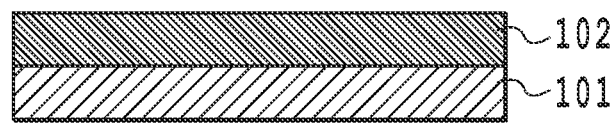
FIG. 1 is a schematic cross-sectional view of a compound semiconductor substrate, including a compound semiconductor layer on Si, according to Example 1 of the present invention.

FIG. 1 is schematic cross-sectional view of a compound semiconductor substrate, including a compound semiconductor layer on a Si substrate, according to Example 1 of the present invention. In the drawing, reference numeral 101 denotes the Si substrate formed of a 4-inch Si single crystal, and reference numeral 102 denotes a compound semiconductor layer containing As.

A single domain structure can be identified on the basis of the number of diffraction lines, with respect to a crystallographic axis direction, observed in an X-ray diffraction experiment. For growth on a Si single crystal cut in parallel with a (111) plane, a crystal plane used for determination of a domain structure is a (220) plane. Since the hetero-epitaxially grown compound semiconductor layer 102 has three-fold symmetry, three diffraction lines are observed in all crystal directions, in a case of a single domain. In a case of a multi-domain structure, more than three diffraction lines thereof are observed.

When the compound semiconductor layer 102 is formed on the Si substrate 101, initial growth which controls an interface therebetween is important. In the present invention, various forms of the interface are obtained depending on: a timing of hydrogen release from the hydrogen-terminated Si substrate 101; a material with which the Si substrate 101 is irradiated; and timing of the irradiation.

Regarding the interface between the Si single crystal 101 and the compound semiconductor 102, a substance having an As concentration higher than that of the compound semiconductor layer 102 containing As can be provided at the interface between the Si substrate 101 and the compound semiconductor layer 102 containing As in the following manner. Specifically, only As is irradiated onto the Si substrate 101 before the hydrogen release, and then hetero-epitaxial growth of the compound semiconductor is started.

The fact that the substance present at the interface has the As concentration higher than that of the compound semiconductor layer 102, and is discretely present at the interface in island-like pieces can be confirmed in the following manner. Specifically, this sample is sliced into a thin plate having a thickness of 10 nm or less by use of a microfabrication apparatus such as a focused ion beam (FIB). Then, the thin plate is subjected to two-dimensional observation of an electron energy loss spectrum (EELS) by use of an ultrahigh-voltage electron microscope having an acceleration energy of approximately 1,000 keV.

Meanwhile, the fact that the substance present at the interface and having the high As concentration has a crystalline orientation different from those of the Si substrate and the compound semiconductor layer, and is not epitaxially grown with respect to the Si substrate can be observed with an ultrahigh-voltage electron microscope having an acceleration energy of approximately 1,000 keV.

Figure 5:
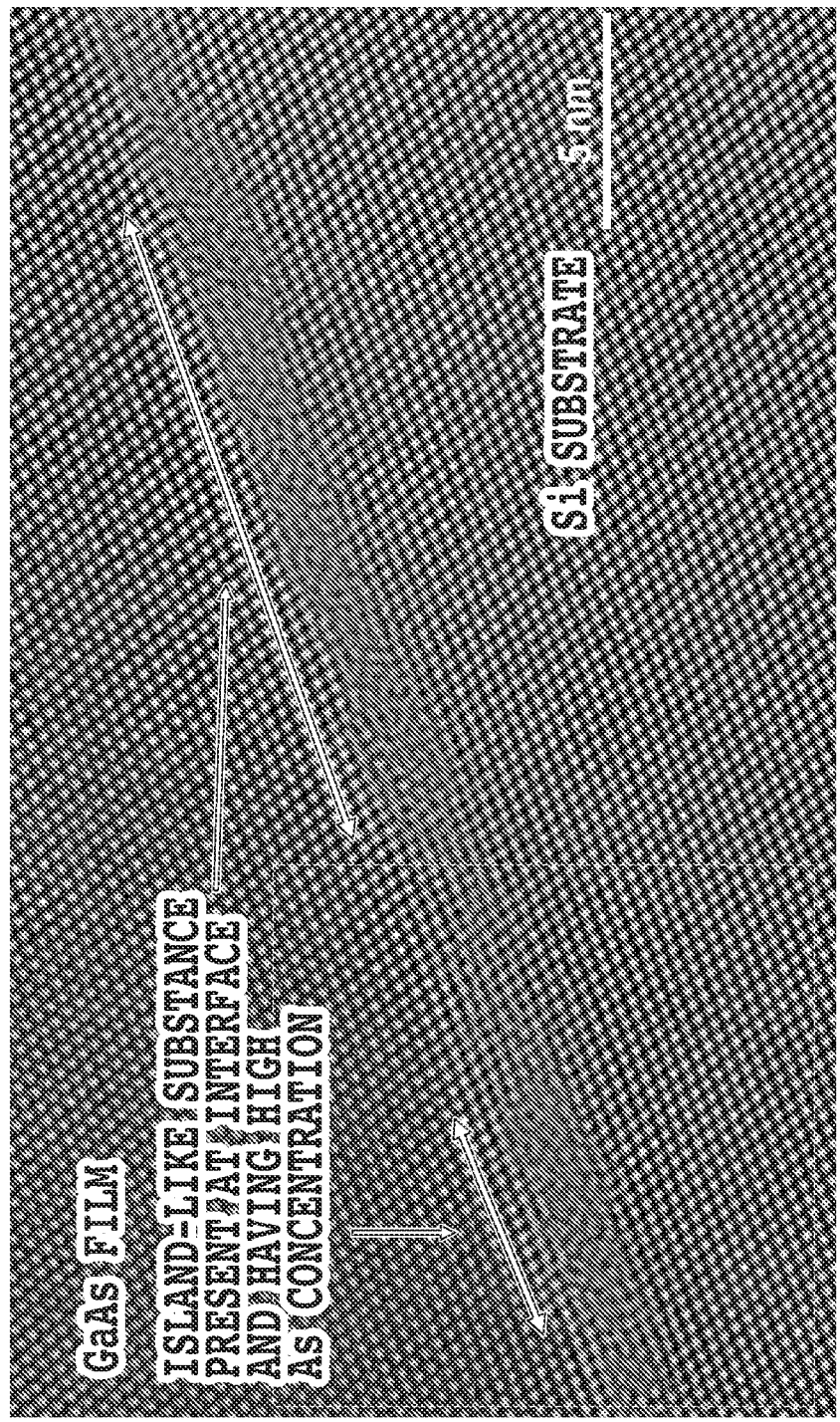
FIG. 5 is a cross-sectional view of an island-like substance present at an interface, and having a high As concentration.
Figure 6:
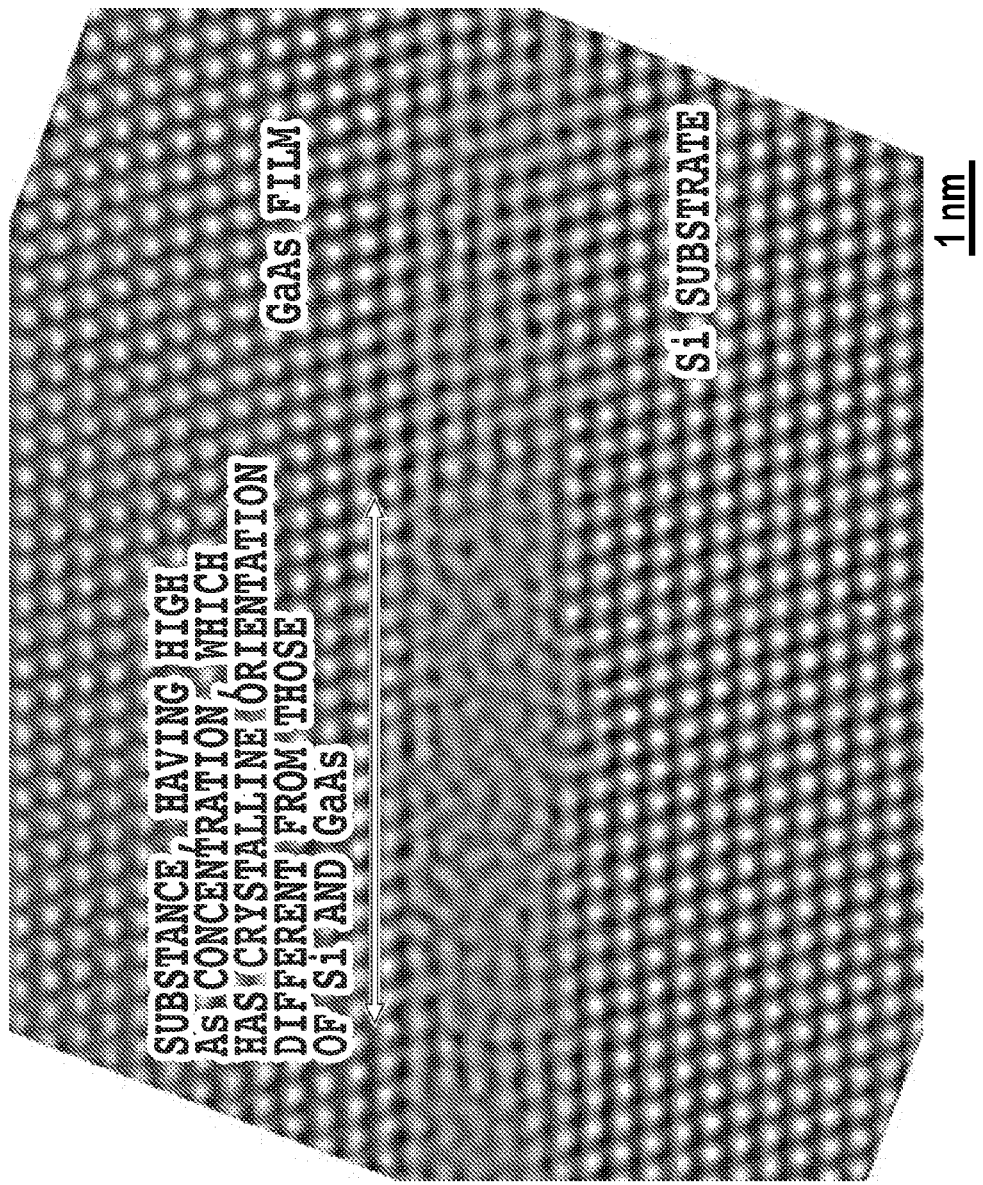
FIG. 6 is an enlarged view of FIG. 5.

FIG. 5 is a cross-sectional view of the island-like substance present at the interface and having a high As concentration, showing, as an example, an ultrahigh-voltage electron microscope photograph of a GaAs film formed on Si in the invention of the present application. Meanwhile, FIG. 6 is an enlarged view of FIG. 5, showing a result observed at an acceleration voltage of 1,250 keV. It can be observed that the island-like substance present at the interface and having a high As concentration has the crystalline orientation, observed by EELS, different from those of the Si substrate and the compound semiconductor layer, and is not epitaxially grown on the Si substrate. Regarding the island-like substance having a high As concentration, there can be seen pieces measured as being approximately 2 nm or less in a thickness direction with one and the other one thereof measured as being approximately 6 nm and approximately 16 nm, respectively, in a lateral direction of the interface.

It was confirmed that employment of this structure improves the dislocations (defects) present at the interface between the Si substrate 101 and the compound semiconductor layer 102. Thereby, the present invention has been completed.

As described above, the compound semiconductor substrate of the present invention is a compound semiconductor substrate obtained by providing, on the Si substrate 101, the compound semiconductor layer containing As. In the compound semiconductor substrate, the substance having a higher As concentration than the compound semiconductor layer 102 is present, in an island-like manner, at the interface between the Si substrate 101 and the compound semiconductor layer 102.

In addition, the island-like substance is made of part of constituent elements of any one of the Si substrate 101 and the compound semiconductor layer 102. Moreover, the island-like substance is not epitaxially grown with respect to the Si substrate 101.

The island-like substance has a crystalline orientation different from those of the Si substrate 101 and the compound semiconductor layer 102. The crystal dislocations (defects) of the compound semiconductor layer 102 is $5.0 \times 10^8/cm^2$ or more but $2.5 \times 10^{10}/cm^2$ or less at a location 10 nm away from the interface between the Si substrate 101 and the compound semiconductor layer 102.

A film thickness of the compound semiconductor layer 102 is 0.1 μm or more but 2.0 μm or less. A surface area of a film formation surface of the Si substrate 101 is 10 cm² or more. The compound semiconductor layer 102 has a single domain structure. The compound semiconductor layer 102 is made of $In_xAl_yGa_zAs$ (x+y+z=1). The Si substrate 101 may be a Si thin-film substrate.

Figure 3:
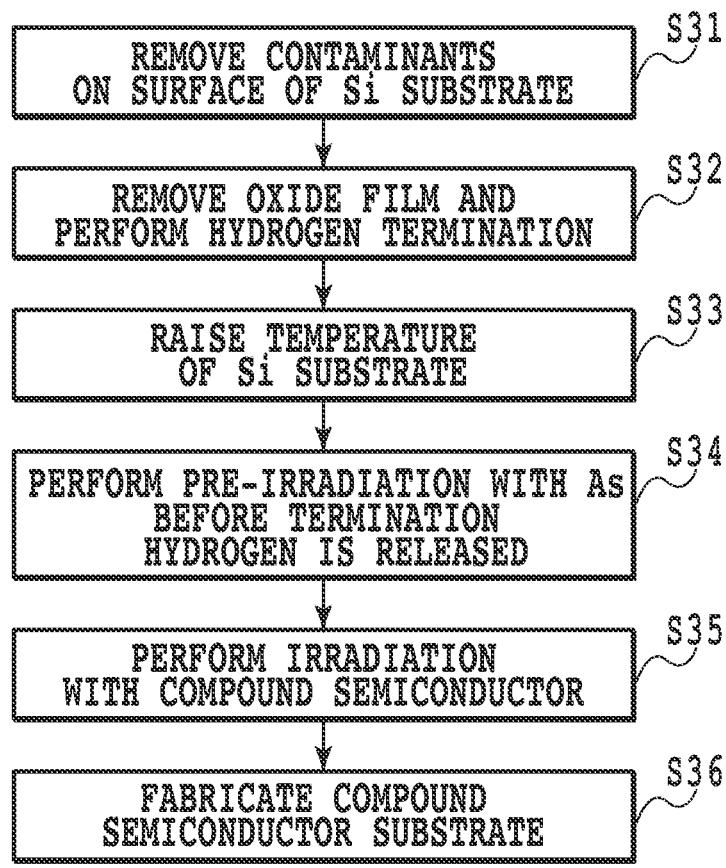
FIG. 3 is a diagram showing a flowchart for describing a method for producing the compound semiconductor substrate of Example 1 according to the present invention.

FIG. 3 is a diagram showing a flowchart for describing a method for producing the compound semiconductor substrate of Example 1 according to the present invention. Here, description will be given of an example in which a GaAs compound semiconductor layer 102 was formed on a 4-inch Si substrate 101.

First, contaminants, such as organic matter and metal, on a surface of the Si substrate 101 were removed by subjecting the Si substrate 101 sequentially to organic washing, acid washing and alkaline washing, whereby a flat oxide film (not shown) was formed (Step S31). Next, the oxide film on the surface was removed by use of an aqueous hydrogen fluoride solution having a concentration of 1.0% by weight, whereby hydrogen termination treatment was performed (Step S32). Note that the hydrogen termination treatment may be performed by another method. For example, treatment with a buffered aqueous hydrofluoric acid solution, hydrogen annealing, atomic hydrogen irradiation, or the like may be employed.

Next, the Si substrate 101 immediately after being subjected to the hydrogen termination treatment was placed in a vacuum apparatus with a vacuum degree of $10^{-6}$ Torr ($1.333 \times 10^{-4}$ Pa [pascal]) or less, and then the temperature of the Si substrate 101 was raised (Step S33). If the substrate temperature is raised without any operation, the termination hydrogen is released. Before the hydrogen was released, pre-irradiation with As, which is a compound semiconductor material, was performed (Step S34). Thus, an interface between the Si substrate 101 and the compound semiconductor layer 102 was prepared. Several minutes later, irradiation with Ga and As was performed (Step S35). Thereby, the compound semiconductor substrate was fabricated (Step S36). In this step, only after Ga arrived at the substrate, a large amount of hydrogen was released from the Si substrate. This state can be detected with a quadrupole mass spectrometer. In general, in-situ analysis called reflection high energy electron diffraction (RHEED) can be performed for MBE. However, if RHEED measurement is performed, hydrogen on the Si is released because of energy of electron beams. Hence, preferably, RHEED is not used during initial growth in implementing the invention of the present application.

This compound semiconductor layer 102 is 0.5 μm. In determination of a domain structure by an X-ray diffraction experiment, it was found that the domain structure was a single domain. This sample was sliced into a thin plate having a thickness of approximately 10 nm, and this thin plate was subjected to two-dimensional observation of electron energy loss spectrum (EELS) by use of an ultrahigh-voltage electron microscope having an acceleration energy of 1,250 keV. Thereby, it was found that a substance having an As concentration higher than an As concentration in the GaAs was present in an island-like manner at the interface between the GaAs and the Si substrate. In addition, cross-sectional observation with an ultrahigh pressure electron microscopy showed that the substance having a high As concentration present at the interface has a crystalline orientation different from those of the Si substrate and the compound semiconductor layer, and was not epitaxially grown with respect to the Si substrate.

The dislocations (defects) of the compound semiconductor layer 102 at the interface are shown by a density of dislocations present in the compound semiconductor 102 at the interface. The density of dislocations is measured as follows. Specifically, a thin plate is prepared from a sample by use of an ion milling machine, then, a cross-sectional TEM image of the thin plate was taken at 2 million-fold magnification, and dislocations (defects) which are in the compound semiconductor (GaAs) layer 102 and which penetrate a location 10 nm away from the interface with the Si substrate 101 are measured. Table 1 shows the results of dislocation density measurement at three different points (A, B, and C).

COMPARATIVE EXAMPLE 1

A Si substrate immediately after being subjected to a hydrogen termination treatment was placed in a vacuum apparatus with a vacuum degree of $10^{-6}$ Torr ($1.333 \times 10^{-4}$ Pa [pascal]) or less, and then the temperature of the Si substrate was raised. If the substrate temperature is raised without any operation, the termination hydrogen is released. Before the hydrogen was released, simultaneous irradiation with As and Ga was performed. Thus, an interface between the Si substrate and a compound semiconductor layer was prepared, and the compound semiconductor layer was formed. This compound semiconductor layer is 0.5 μm. Here, in determination of a domain structure by an X-ray diffraction experiment, it was found that the domain structure was a single domain. This sample is sliced into a thin plate having a thickness of approximately 10 nm, and this thin plate is subjected to two-dimensional observation of electron energy loss spectrum (EELS) by use of an ultrahigh-voltage electron microscope having an acceleration energy of 1,250 keV. As a result, it was found that no substance having a high As concentration was present at an interface between the GaAs and the Si substrate.

As in the case of Example 1, with respect to the dislocations (defects) of the compound semiconductor layer 102 at the interface, a sample is sliced into a thin plate by use of an ion milling machine, then, a cross-sectional TEM image of the thin plate was taken at 2 million-fold magnification, and dislocations (defects) in the compound semiconductor (GaAs) layer 102 which penetrate a location 10 nm away from the interface with the Si substrate 101 were measured. Then, a density of dislocations present in the compound semiconductor layer 102 at the interface was found based on this measurement.

Table 1 shows results of the measurement at three points (A, B, and C) of the 4-inch compound semiconductor substrate of each of Example 1 and Comparative Example 1, the three points having different interface dislocation densities.

TABLE 1

| Dislocation Density | Interface | | |
|---|---|---|---|
| | A | B | C |
| Example 1 | $1.0 \times 10^{10}/cm^2$ | $1.8 \times 10^{10}/cm^2$ | $1.1 \times 10^{10}/cm^2$ |
| Comparative Example 1 | $1.7 \times 10^{11}/cm^2$ | $3.1 \times 10^{10}/cm^2$ | $1.8 \times 10^{11}/cm^2$ |

As described in Example 1, immediately before the growth of the compound semiconductor layer, irradiation with only As, which was a gas source, was performed. Thereby, the interface dislocation density was successfully improved to a large extent over the entire compound semiconductor substrate. In addition, the comparison of {(the maximum)−(the minimum)} shows that the dispersion was improved nearly 20-fold.

EXAMPLE 2

Figure 2:
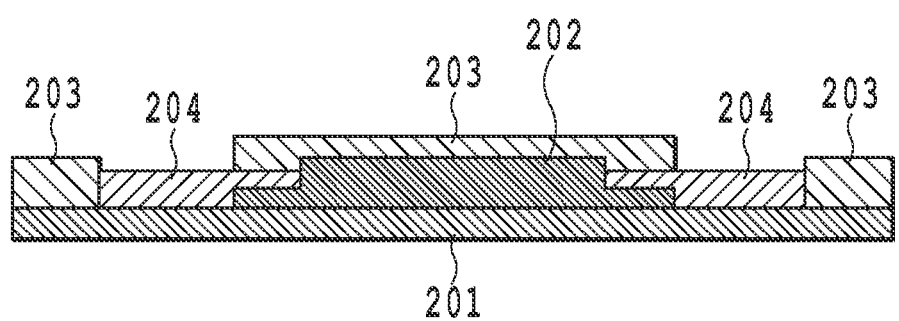
FIG. 2 is a schematic cross-sectional view of a Hall element fabricated by use of the compound semiconductor substrate of Example 1.

FIG. 2 is a schematic cross-sectional view of a Hall element fabricated by use of the compound semiconductor substrate of Example 1. In the drawing, reference numeral 201 denotes the compound semiconductor substrate, reference numeral 202 denotes a sensing part of the Hall element, reference numeral 203 denotes a protection film formed of Si nitride, and reference numeral 204 denotes a multilayer electrode part of Au/Ti.

The sensing part 202 of a Hall element is provided on the compound semiconductor substrate 201 prepared in Example 1. The multilayer electrode part 204 of Ti/Au is provided around the sensing part 202 of a Hall element and on the compound semiconductor substrate 201. The protection film 203 formed of Si nitride is provided above the compound semiconductor substrate 201 and on a side portion of the multilayer electrode part 204. Besides, the protection film 203 formed of Si nitride is provided on the sensing part 202 of a Hall element. Note that, when the resistance of the Si substrate is small, an insulating layer is preferably provided between the Si substrate 201 and the multilayer electrode part 204.

In order to demonstrate that, when a semiconductor device related to a compound semiconductor is formed on the compound semiconductor substrate 201 prepared in Example 1 described above, the dislocations (defects) at the interface have an influence on the characteristics of the device, a Hall element was fabricated as an example of a compound semiconductor device, and comparison of the characteristics was performed.

A layer of InSb, which is a compound semiconductor, was stacked on the compound semiconductor substrate prepared in each of Example 1 and Comparative Example 1. Thereby, Hall elements were attempted to be formed. Table 2 shows a mobility of the InSb formed on the compound semiconductor substrate 201 prepared in each of Example 1 and Comparative Example 1. Van der Pauw measurement was performed, while cutting-out in a dimension of 10 mm square was performed thereon. The average values and the standard deviations are shown. In the comparative example, although the mobility was 40,000 or more at some points, the dispersion was large, and the average is slightly below 20,000 with a large distribution (standard deviation) of 50%. In contrast, in the example of the invention of the present application, a high mobility was obtained at any point on the substrate.

TABLE 2

| | Electron Mobility ($cm^2/V \cdot s$) | Standard deviations (%) |
|---|---|---|
| Example 1 | 41218 | 5.6 |
| Comparative Example 1 | 19360 | 50 |

Figure 4:
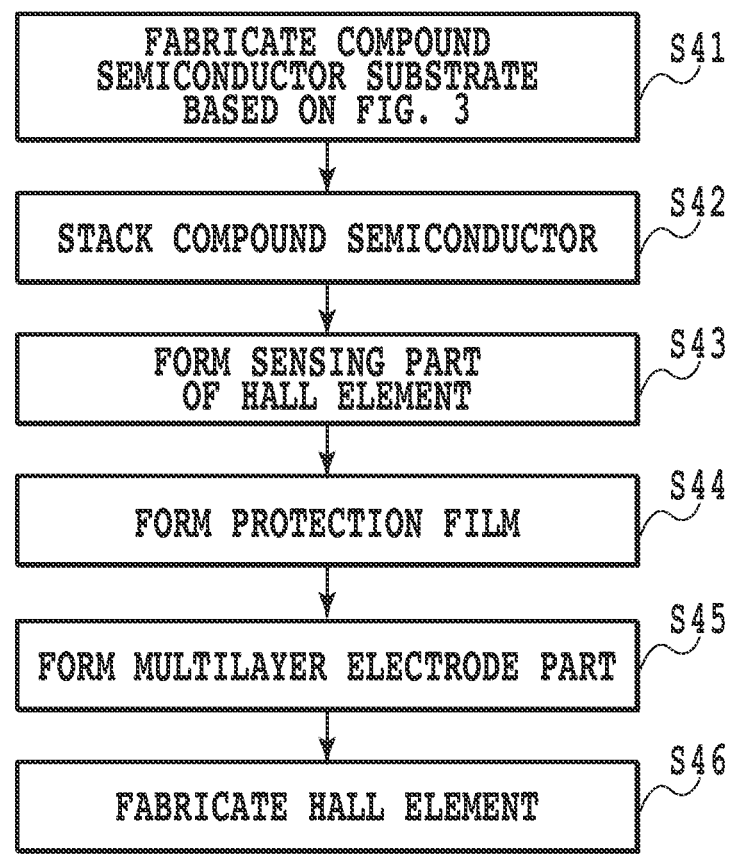
FIG. 4 is a diagram showing a flowchart for describing a method for producing the Hall element of Example 2 according to the present invention.

FIG. 4 is a diagram showing a flowchart for describing a method for producing a Hall element of Example 2 according to the present invention. First, on the basis of FIG. 3, a compound semiconductor substrate 201 was fabricated (Step S41). A layer of InSb was stacked on the fabricated compound semiconductor substrate 201 (Step S42). A sensing part 202 of a Hall element was formed through mesa etching (Step S43). Thereafter, a protection film 203 of Si nitride was formed by plasma CVD (Step S44). An Au/Ti multilayer electrode part 204 was formed by vapor deposition (Step 45). Then, the Hall element was fabricated (Step S46).

Table 3 shows results of comparison between the Hall elements of Example 1 and Comparative Example 1 with respect to electrical characteristics thereof. Here, average values and standard deviations of unbalanced (offset) voltages, which are output voltages under no magnetic field, of all the Hall elements fabricated were compared. Note that the unbalanced (offset) voltage was set to a voltage obtained at an output terminal under no magnetic field with a voltage of 1 V being applied to an input terminal.

TABLE 3

| | Average values of unbalanced voltages | Standard deviations of unbalanced voltages |
|---|---|---|
| Example 1 | −0.1 mV | 0.5 mV |
| Comparative Example 1 | −0.2 mV | 4.9 mV |

Patent Document 2 reported that an offset voltage is greatly influenced by the crystallinity of a compound semiconductor layer which serves as an active layer of a Hall element, and that the offset voltage of a Hall element fabricated on a compound semiconductor having a small number of dislocations (defects) tends to be small. In addition, since physical properties, other than the dislocation density, such as etching rate and crystallinity, which influence the offset voltage, are uniform within a wafer surface, it is conceivable that the example provided an effect.

Comparison between the standard deviations of offset voltage of Example 1 and Comparative Example 1 shows that the standard deviation of offset voltages of the compound semiconductor substrates (Example 1) for which pre-irradiation with As, which was a gas source, was performed is significantly small.

This is presumably because the dislocations (defects) at the interface between the Si substrate and the compound semiconductor substrate were small in number and were distributed uniformly within a wafer surface. It was found that, if a device related to a compound semiconductor is fabricated on a compound semiconductor substrate having a reduced average value and a reduced standard deviation of a dislocation (defect) density at an interface, deterioration in characteristics associated with the dislocations (defects) and decrease in the yield of wafers in mass production can be suppressed. This proves a significant effect of the invention of the present application.

Industrial Applicability

The compound semiconductor substrate of the present invention has a reduced dislocation (defect) density in the vicinity of the interface. Thereby, a compound semiconductor substrate with a high mass-productivity is provided. Moreover, the compound semiconductor substrate can be used for improvement in characteristics, improvement in luminous efficacy and improvement in S/N, respectively, in a semiconductor electronic device, an optical device and a magnetic sensor each fabricated by use of hetero-epitaxial growth on a compound semiconductor substrate.

The invention claimed is:

1. A compound semiconductor substrate in which a compound semiconductor layer containing As is provided on a Si substrate the compound semiconductor substrate comprising:
    an island-like substance at an interface between the Si substrate and the compound semiconductor layer, the island-like substance containing higher As concentration than the compound semiconductor layer,
    wherein the Si substrate has a (111) plane, and
    the compound semiconductor substrate has a direct interface between the Si substrate and the compound semiconductor layer in a planar direction of the Si substrate.

2. The compound semiconductor substrate according to claim 1, wherein the island-like substance is made of part of constituent elements of any one of the Si substrate and the compound semiconductor layer.

3. The compound semiconductor substrate according to claim 2, wherein the island-like substance is not epitaxially grown with respect to the Si substrate.

4. The compound semiconductor substrate according to claim 2, wherein crystal dislocations (defects) of the compound semiconductor layer are $5.0 \times 10^8/cm^2$ or more but $2.5 \times 10^{10}/cm^2$ or less at a location 10 nm away from the interface of the Si substrate and the compound semiconductor layer.

5. The compound semiconductor substrate according to claim 1, wherein the island-like substance is not epitaxially grown with respect to the Si substrate.

6. The compound semiconductor substrate according to claim 5, wherein crystal dislocations (defects) of the compound semiconductor layer are $5.0 \times 10^8/cm^2$ or more but $2.5 \times 10^{10}/cm^2$ or less at a location 10 nm away from the interface of the Si substrate and the compound semiconductor layer.

7. The compound semiconductor substrate according to claim 1, wherein crystal dislocations (defects) of the compound semiconductor layer are $5.0 \times 10^8/cm^2$ or more but $2.5 \times 10^{10}/cm^2$ or less at a location 10 nm away from the interface of the Si substrate and the compound semiconductor layer.

8. The compound semiconductor substrate according to claim 1, wherein a film thickness of the compound semiconductor layer is 0.1 μm or more but 2.0 μm or less.

9. The compound semiconductor substrate according to claim 1, wherein a surface area of a film formation surface of the Si substrate is 10 $cm^2$ or more.

10. The compound semiconductor substrate according to claim 1, wherein the compound semiconductor layer has a single domain structure.

11. The compound semiconductor substrate according to claim 1, wherein the compound semiconductor layer is made of $In_xAl_yGa_zAs$ (x+y+z=1).

12. The compound semiconductor substrate according to claim 1, wherein the Si substrate is a Si thin-film substrate.

13. A semiconductor device comprising the compound semiconductor substrate according to claim 1 used therein.

14. The semiconductor device according to claim 13, wherein the semiconductor device is any one of an electronic device, an optical device, a magnetic sensor, a solar cell, and an ultrahigh-speed device using two-dimensional electron gas.

* * * * *